United States Patent
Oh et al.

(10) Patent No.: US 12,456,671 B2
(45) Date of Patent: Oct. 28, 2025

(54) SEMICONDUCTOR PACKAGE

(71) Applicant: SAMSUNG ELECTRONICS CO., LTD., Suwon-si (KR)

(72) Inventors: Eunkyul Oh, Suwon-si (KR); Chonghee Lee, Suwon-si (KR); Keunho Jang, Suwon-si (KR); Yunrae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/130,197

(22) Filed: Apr. 3, 2023

(65) Prior Publication Data
US 2023/0420355 A1 Dec. 28, 2023

(30) Foreign Application Priority Data
Jun. 27, 2022 (KR) .......................... 10-2022-0078357

(51) Int. Cl.
*H01L 23/498* (2006.01)
*H01L 23/00* (2006.01)
(Continued)

(52) U.S. Cl.
CPC .... *H01L 23/49838* (2013.01); *H01L 23/3128* (2013.01); *H01L 23/49822* (2013.01); *H01L 24/13* (2013.01); *H01L 24/16* (2013.01); *H01L 24/32* (2013.01); *H01L 24/73* (2013.01); *H01L 24/05* (2013.01); *H01L 24/48* (2013.01); *H01L 24/81* (2013.01); *H01L 2224/0401* (2013.01);
(Continued)

(58) Field of Classification Search
CPC ......... H01L 23/49838; H01L 23/49822; H01L 23/3128; H01L 24/32; H01L 24/16; H01L 24/73; H01L 24/13; H01L 2224/16227; H01L 2224/32225; H01L 2224/73204; H10B 80/00
USPC .......................................................... 257/668
See application file for complete search history.

(56) References Cited

U.S. PATENT DOCUMENTS 9,412,712 B2  8/2016  Jang et al.
10,431,533 B2  10/2019  Topacio et al.
(Continued)

FOREIGN PATENT DOCUMENTS

JP         2021129026 A    9/2021
KR    10-2009-0056560 A    6/2009
(Continued)

*Primary Examiner* — Jasmine J Clark
(74) *Attorney, Agent, or Firm* — Sughrue Mion, PLLC (57) ABSTRACT

A semiconductor package includes a package substrate including a redistribution layer including first pads and second pads on an upper surface thereof and a solder mask layer having an opening exposing the first pads entirely and exposing at least portion of each of the second pads, a semiconductor chip on the upper surface of the package substrate and including connection pads electrically connected to the redistribution layer, connection bumps below the semiconductor chip and connecting the connection pads to the first pads, and a non-conductive film layer between the semiconductor chip and the package substrate, wherein the second pads are respectively disposed on both sides of the first pads at least in a first direction, and the connection bumps are spaced apart from the second pads and the solder mask layer in the first direction.

20 Claims, 11 Drawing Sheets (51) Int. Cl.
*H01L 23/31* (2006.01)
*H10B 80/00* (2023.01)

(52) U.S. Cl.
CPC ............... *H01L 2224/05624* (2013.01); *H01L 2224/05647* (2013.01); *H01L 2224/05684* (2013.01); *H01L 2224/13111* (2013.01); *H01L 2224/13139* (2013.01); *H01L 2224/13147* (2013.01); *H01L 2224/16227* (2013.01); *H01L 2224/32225* (2013.01); *H01L 2224/48145* (2013.01); *H01L 2224/48227* (2013.01); *H01L 2224/73204* (2013.01); *H01L 2224/81411* (2013.01); *H01L 2224/81439* (2013.01); *H01L 2224/81444* (2013.01); *H01L 2224/81455* (2013.01); *H10B 80/00* (2023.02)

(56) References Cited

U.S. PATENT DOCUMENTS

| | | |
|---|---|---|
| 2009/0140422 A1 | 6/2009 | Park |
| 2016/0260659 A1* | 9/2016 | Hsieh ................ H01L 23/49822 |
| 2019/0013263 A1 | 1/2019 | Kyozuka et al. |
| 2021/0335705 A1 | 10/2021 | Kiso |

FOREIGN PATENT DOCUMENTS

| | | |
|---|---|---|
| KR | 10-2032306 B1 | 10/2019 |
| KR | 10-2076479 B1 | 2/2020 |
| KR | 10-2021-0114197 A | 9/2021 |

* cited by examiner

SEMICONDUCTOR PACKAGE

CROSS-REFERENCE TO RELATED APPLICATION

This application is based on and claims priority to Korean Patent Application No. 10-2022-0078357 filed on Jun. 27, 2022 in the Korean Intellectual Property Office, the disclosure of which is incorporated by reference herein in its entirety.

BACKGROUND

The present disclosure relates to a semiconductor package.

Semiconductor chips are mounted on package substrates through various types of connection bumps. The semiconductor chips receive power from the package substrates or transmit signals to the package substrates through connection bumps. In particular, as semiconductor chips are increasingly implemented with higher levels of performance and are more highly integrated, connection bumps connected to the semiconductor chips are arranged at a finer pitch.

SUMMARY

It is an aspect to provide a semiconductor package having improved reliability.

According to an aspect of one or more embodiments, there is provided a semiconductor package includes a package substrate including a redistribution layer including first pads and second pads on an upper surface thereof and a solder mask layer having an opening exposing the first pads entirely and exposing at least portion of each of the second pads, a semiconductor chip on the upper surface of the package substrate and including connection pads electrically connected to the redistribution layer, connection bumps below the semiconductor chip and connecting the connection pads to the first pads, and a non-conductive film layer between the semiconductor chip and the package substrate, wherein the second pads are respectively on both sides of the first pads at least in a first direction, and the connection bumps are spaced apart from the second pads and the solder mask layer in the first direction.

According to another aspect of one or more embodiments, there is provided a semiconductor package includes a package substrate including a redistribution layer including first pads and second pads on an upper surface thereof and a solder mask layer having an opening exposing the first pads entirely and exposing at least portion of each of the second pads, a semiconductor structure on the upper surface of the package substrate and including connection pads electrically connected to the redistribution layer, and connection bumps connecting the connection pads to the first pads, wherein the second pads are respectively disposed on both sides of a group of the first pads in a first direction, the first pads and the second pads are arranged at a first pitch, and the connection bumps are spaced apart from the solder mask layer by a distance of about 30% or more of the first pitch in the first direction.

According to yet another aspect of one or more embodiments, there is provided a semiconductor package includes a package substrate including a redistribution layer including first pads and second pads on an upper surface thereof and a solder mask layer having an opening exposing the first pads entirely and exposing at least portion of each of the second pads, a semiconductor chip on the upper surface of the package substrate and including connection pads electrically connected to the redistribution layer, connection bumps connecting the connection pads to the first pads, and a non-conductive film layer between the semiconductor chip and the package substrate and surrounding the connection bumps, wherein the second pads are respectively disposed on both sides of a group of the first pads in a first direction, and upper surfaces and side surfaces of the second pads are entirely covered by the solder mask layer and the non-conductive film layer.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, various example embodiments will be described with reference to the accompanying drawings.

Unless otherwise specified, in this specification, terms, such as 'upper, 'upper surface,' 'lower,' 'surface,' and 'side surface' are based on the drawings, and may vary in reality depending on a direction in which a device is disposed.

Figure 1:
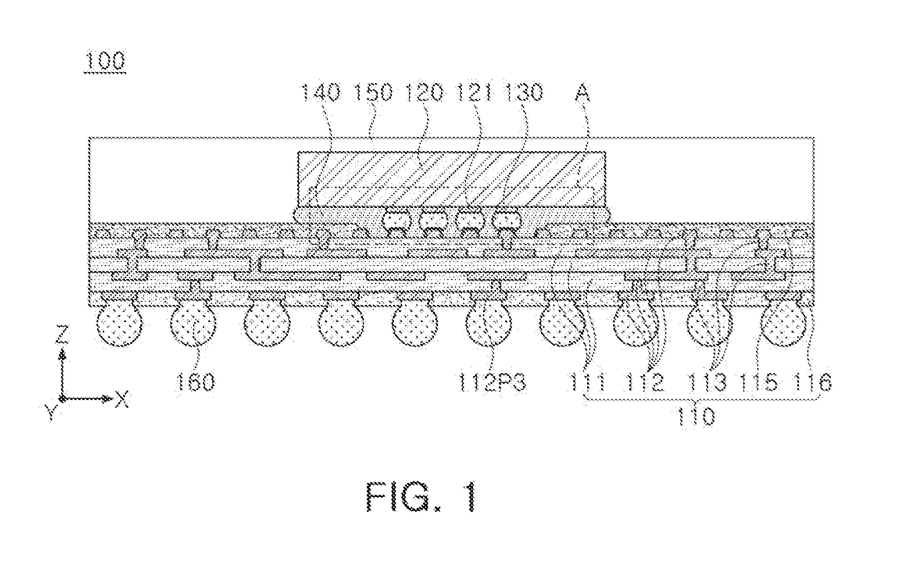
FIG. 1 is a schematic cross-sectional view of a semiconductor package according to example embodiments.

FIG. 1 is a schematic cross-sectional view of a semiconductor package according to example embodiments.

Figure 2A:
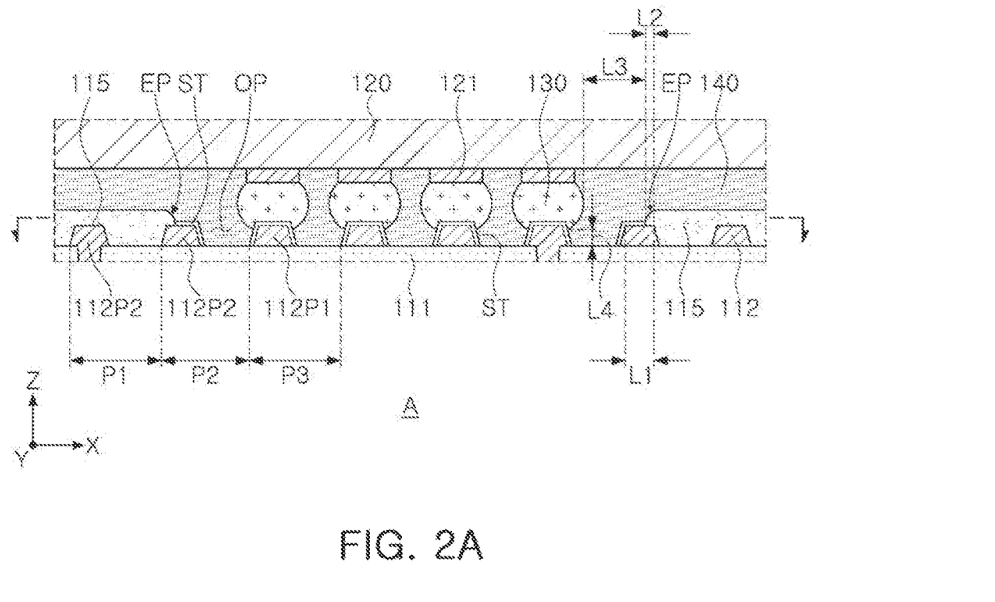
FIG. 2A is a schematic partially enlarged view of a semiconductor package according to example embodiments.

FIG. 2A is a schematic partially enlarged view of a semiconductor package according to example embodiments. FIG. 2A is an enlarged view of area 'A' of FIG. 1.

Figure 2B:
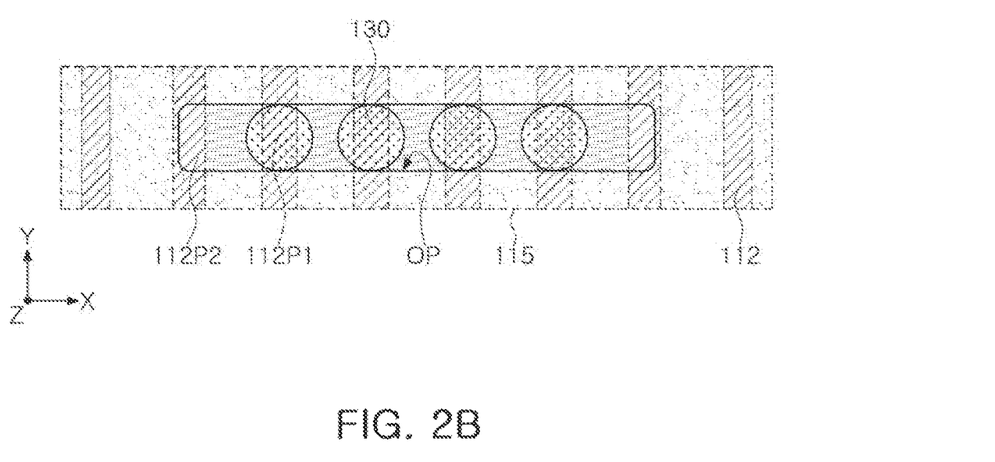
FIG. 2B is a schematic partial plan view of a semiconductor package according to example embodiments.

FIG. 2B is a schematic partial plan view of a semiconductor package according to example embodiments. FIG. 2B is an enlarged view of a portion of a plane taken along line I-I' of FIG. 2A.

Referring to FIGS. 1 to 2B, a semiconductor package 100 may include a package substrate 110, a semiconductor chip 120 on the package substrate 110, connection bumps 130 connecting the semiconductor chip 120 to the package substrate 110, a non-conductive film layer 140 between the semiconductor chip 120 and the package substrate 110, an encapsulant 150 sealing the semiconductor chip 120, and package bumps 160.

The package substrate 110, as a support substrate on which the semiconductor chip 120 is mounted, may be a package substrate for redistributing connection pads 121 of the semiconductor chip 120. The package substrate may include a printed circuit board (PCB), a ceramic substrate, a glass substrate, a tape wiring board, and/or the like. The package substrate 110 may include insulating layers 111, redistribution layers 112, redistribution vias 113, a first solder mask layer 115, and a second solder mask layer 116. In embodiments, the number of layers of the insulating layers 111 and the redistribution layers 112 included in the package substrate 110 may be variously changed. In some embodiments, the package substrate 110 may be an interposer substrate, for example, an organic interposer. In some embodiments, the package substrate 110 may be a module substrate, and in this case, the semiconductor chip 120 may be a semiconductor structure, such as a semiconductor package.

The insulating layers 111 include an insulating material, for example, a thermosetting resin, such as an epoxy resin, or a thermoplastic resin, such as polyimide. For example, the insulating layers 111 may include a photosensitive insulating material, such as a photoimageable dielectric (PID) resin. In some embodiments, the insulating layers 111 may include a resin mixed with an inorganic filler, for example, Ajinomoto build-up film (ABF). In some embodiments, the insulating layers 111 may include prepreg, flame retardant (FR-4), or bismaleimide triazine (BT). The insulating layers 111 may include the same or different materials. A boundary between the insulating layers 111 may not be apparent depending on materials constituting each layer and processes.

The redistribution layers 112 and the redistribution vias 113 may form an electrical path. The redistribution layers 112 and the redistribution vias 113 may redistribute the semiconductor chip 120 to a region outside the semiconductor chip 120, that is, to a fan-out region that does not overlap the semiconductor chip 120 in a Z-direction. Accordingly, in some embodiments, the semiconductor package 100 may be referred to as a fan-out semiconductor package. However, the shape of the semiconductor package is not limited thereto, and in some embodiments, the semiconductor package 100 may form a fan-in semiconductor package. The redistribution layers 112 and the redistribution vias 113 may include a ground pattern, a power pattern, and/or a signal pattern. The redistribution layers 112 may be disposed in a line shape on an X-Y plane, and the redistribution vias 113 may have a cylindrical shape with inclined side surfaces to have a width narrowing downwardly or upwardly. Although the redistribution vias 113 are illustrated as having a filled via structure in which the inside is completely filled with a conductive material, the redistribution vias 113 are not limited thereto. For example, in some embodiments, the redistribution vias 113 may have a conformal via shape in which a metal material is formed along an inner wall of the via hole.

The redistribution layers 112 and the redistribution vias 113 may include a conductive material, for example, copper (Cu), aluminum (Al), silver (Ag), tin (Sn), gold (Au), nickel (Ni), lead (Pb), titanium (Ti), and/or alloys thereof.

The redistribution layers 112 may include first pads 112P1 and second pads 112P2 exposed through the first solder mask layer 115, and third pads 113P3 exposed through the second solder mask layer 116. A portion of the redistribution layers 112 may form the first and second pads 112P1 and 112P2. For example, in some embodiments, an uppermost layer of the redistribution layers 112 may form the first and second pads 112P1 and 112P2. A portion of the redistribution layers 112 may form the third pads 112P3. For example, in some embodiments, a lowermost layer of the plurality of redistribution layers 112 may form the third pads 112P3. Each of the first and second pads 112P1 and 112P2 may include a surface treatment layer ST disposed on a surface exposed from the first solder mask layer 115. The surface treatment layer ST may be disposed on the entire surface of the first pads 112P1 and may be disposed on a portion of the surfaces of the second pads 112P2 exposed through an opening OP. The surface treatment layer ST may include, for example, at least one of gold (Au), tin (Sn), silver (Ag), or nickel (Ni). Although not illustrated, the third pads 113P3 may further include a surface treatment layer disposed on the surface exposed from the second solder mask layer 116.

The first pads 112P1 may be pads for mounting the semiconductor chip 120. The first pads 112P1 may be pads entirely exposed by the first solder mask layer 115, and may be connected to the connection bumps 130. For example, the firs pads 112P1 may comprises a plurality of first pads 112P1 that are entirely exposed by the opening OP in the first solder mask layer 115. The second pads 112P2 may be pads at least partially exposed by the first solder mask layer 115, and may not be connected to the connection bumps 130. In the second pads 112P2, upper surfaces and side surfaces exposed from the first solder mask layer 115 may be covered with the non-conductive film layer 140 and may be in contact with the non-conductive film layer 140. One second pad 112P2 may be respectively disposed on each side of the group of first pads 112P1 in at least one direction, for example, the X-direction. In the example illustrated in FIG. 2A, there are two second pads 112P2 that are partially exposed with four first pads 112P1 that are between the two second pads 112P2 and that are entirely exposed from the first solder mask layer 115. The third pads 112P3 may be pads connected to the package bumps 160.

As illustrated in FIG. 2A, the second pads 112P2 may be disposed with the adjacent redistribution layer 112 at a first pitch P1. For example, the second pads 112P2 disposed in the first solder mask layer 115 may be disposed at the first pitch P1. "Pitch" may be a distance between the centers or the distance between the ends of components, and may correspond to the sum of a width of the component and a spacing distance between the components according to the one direction. The second pad 112P2 may be disposed at a second pitch P2 with the first pad 112P1 adjacent thereto, as illustrated in FIG. 2A. The second pitch P2 may be equal to or smaller than the first pitch P1. The first pads 112P1 may be arranged at a third pitch P3, and the connection bumps 130 may also be arranged at the third pitch P3. The third pitch P3 may be, for example, in a range of about 10 μm to about 100 μm. The second pitch P2 may be equal to or smaller than twice the third pitch P3. For example, the second pitch P2 may be greater than the third pitch P3 and smaller than twice the third pitch P3. Since the second pitch P2 is relatively large, a spacing distance between the first solder mask layer 115 and the first pad 112P1 and a length L3 between the first solder mask layer 115 and the connection bump 130 may be reliably secured. An arrangement relationship between the first and second pads 112P1 and 112P2 and the first solder mask layer 115 will be described in more detail below.

The first and second solder mask layers 115 and 116 each may be a solder resist layer protecting the redistribution layer 112 from external physical and chemical damage. The first and second solder mask layers 115 and 116 may include an insulating material, for example, prepreg, ABF, FR-4, BT, or photo solder resist (PSR). The first solder mask layer 115 may form an upper surface of the package substrate 110 and may have the opening OP exposing at least a portion of the redistribution layer 112, for example, exposing the first pads 112P1 and at least a portion of the second pads 112P2. The second solder mask layer 116 may have a plurality of openings exposing at least a portion of the redistribution layer 112, for example, the third pads 112P3.

As illustrated in FIG. 2A, an end portion EP defining the opening OP in the X-direction in the first solder mask layer 115 may be positioned on upper surfaces of the second pads 112P2. The first solder mask layer 115 may partially cover and partially expose upper surfaces of the second pads 112P2. The first solder mask layer 115 may expose side surfaces of the second pads 112P2 facing the first pads 112P1 and may cover opposite side surfaces of the second pads 112P2.

The first solder mask layer 115 may cover a region corresponding to a second length L2 of about 50% or less, and in some embodiments, about 30% or less, of the first length L1 of the upper surfaces of the second pads 112P2. That is, the first solder mask layer 115 may expose at least about 30% of the upper surfaces of the second pads 112P2, for example, about 50% to about 100% of the upper surfaces. A ratio L2/L1 of the first length L1 to the second length L2 may be selected in consideration of the second pitch P2, the lengths of the first and second pads 112P1 and 112P2 in the X-direction, a deviation occurrence range in terms of process, and the like. For example, the ratio L2/L1 may be determined so that at least some of the second pads 112P2 is exposed even when the region in which the opening OP is formed is shifted in the X-direction due to process deviation.

The first solder mask layer 115 may be spaced apart from the adjacent connection bumps 130 by a third length L3 in the X-direction. The third length L3 may be greater than the first length L1, but is not limited thereto. For example, the third length L3 may be about 30% or more of the second pitch P2, for example, in a range of about 30% to about 90%. If the third length L3 is smaller than the above range, the possibility of defects occurring due to process deviation may increase, and if the third length L3 is greater than the above range, the area of the redistribution layers 112 protected by the first solder mask layer 115 may be decreased.

As illustrated in FIG. 2B, the opening OP of the first solder mask layer 115 extends relatively long in one direction, for example, the X-direction, and has a length corresponding to the connection bump 130 in the Y-direction, but is not limited thereto. The first solder mask layer 115 may have one or a plurality of such openings OP.

In the case of a Comparative Example in which the second pads 112P2 are not disposed while the first pads 112P1 are arranged at a fine pitch, the first solder mask layer 115 is lifted from the insulating layer 111 in a region in which the first solder mask layer 115 is adjacent to the opening OP. Specifically, when an end portion of the first solder mask layer 115 is positioned to be adjacent to the first pad 112P1 due to a process deviation during the formation of the opening OP, an etching material for forming the opening OP may remain between the first solder mask layer 115 and the first pad 112P1, so that a lower surface of the first solder mask layer 115 may be lifted from the insulating layer 111. In this case, during a thermal compression bonding (TCB) process for mounting the semiconductor chip 120, a material of the connection bump 130 may extend to the region in which the first solder mask layer 115 is lifted due to capillary action to cause an electrical short with the adjacent redistribution layer 112.

However, in the semiconductor package 100 according to some embodiments, by disposing the second pads 112P2 on both sides of the first pads 112P1 to be in contact with the end portion of the first solder mask layer 115, although a process deviation occurs during formation of the opening OP, the end portion of the first solder mask layer 115 may not be positioned to be adjacent to the first pads 112P1. Accordingly, the occurrence of defects as described above may be prevented.

Returning to FIGS. 1 and 2A, the semiconductor chip 120 may be disposed on the upper surface of the package substrate 110 and may include the connection pads 121 on the lower surface of the semiconductor chip 120. The semiconductor chip 120 may be mounted on the package substrate 110 by a flip-chip bonding method. The semiconductor chip 120 may include an element layer or an active layer disposed below the connection pads 121 and on which an integrated circuit (IC) is disposed. The semiconductor chip 120 may include a logic semiconductor chip and/or a memory semiconductor chip. The logic semiconductor chip may be a micro-processor, for example, a central processing unit (CPU), a graphics processing unit (GPU), a field programmable gate array (FPGA), an application processor (AP), a digital signal processor, a cryptographic processor, a controller, or an application specific integrated circuit (ASIC). The memory semiconductor chip may be a volatile memory, such as dynamic random access memory (DRAM) or static random access memory (SRAM), or a nonvolatile memory, such as flash memory.

A body portion of the semiconductor chip 120 may include silicon (Si), germanium (Ge), gallium arsenide (GaAs), or the like, and the connection pads 121 may include a conductive material, such as tungsten (W), aluminum (Al), copper (Cu), or the like. The connection pads 121 may be a pad of a bare chip, for example, an aluminum (Al) pad, but may also be a pad of a packaged chip, for example, a copper (Cu) pad according to embodiments.

The connection pads 121 may be electrically connected to the redistribution layer 112 through the connection bumps 130. In some embodiments, the connection pads 121 may be disposed in the body portion of the semiconductor chip 120 so that a lower surface thereof forms a lower surface of the semiconductor chip 120. In some embodiments, a passivation layer exposing the connection pads 121 may be further disposed on the lower surface of the semiconductor chip 120. The passivation layer may include a silicon oxide layer and/or a silicon nitride layer.

The connection bumps 130 may physically and electrically connect the connection pads 121 of the semiconductor chip 120 to the first pads 112P1 of the package substrate 110. The connection bumps 130 may not be connected to the second pads 112P2. The connection bumps 130 may have a ball or pillar shape. The connection bumps 130 may cover upper portions of upper surfaces and at least a portion of side surfaces of the first pads 112P1. As described above, the connection bumps 130 may be disposed to be spaced apart from the first solder mask layer 115 by the third length L3 in the X-direction. In the embodiment illustrated in FIGS. 1-2B, the connection bumps 130 may be disposed to be spaced apart from an upper surface of the uppermost insulating layer 111 by a fourth length L4 in the Z-direction.

The connection bumps 130 may include, for example, tin (Sn) or an alloy (Sn—Ag—Cu) including tin (Sn). In embodiments, the number of connection bumps 130 and the number and arrangement of the first pads 112P1 may be variously changed.

The non-conductive film layer 140 may be disposed to surround the connection bumps 130 between the semiconductor chip 120 and the package substrate 110. The non-conductive film layer 140 may also be referred to as an underfill layer. The non-conductive film layer 140 may include a non-conductive polymer, for example, a non-conductive paste (NCP).

The non-conductive film layer 140 may be formed on the lower surface of the semiconductor chip 120 and/or the upper surface of the package substrate 110 during the TCB process, and then fill a gap between the semiconductor chip 120 and the package substrate 110. Accordingly, the non-conductive film layer 140 may have a shape protruding outwardly from the end portions of the semiconductor chip 120 (see, e.g., FIG. 1). A length by which the non-conductive film layer 140 horizontally protrudes from the side surfaces of the semiconductor chip 120 may be greater in the center in the thickness direction than in the lower surface and upper surface of the non-conductive film layer 140. In other words, an edge of the non-conductive film layer 140 may be rounded as illustrated in FIG. 1.

The encapsulant 150 may encapsulate and protect the semiconductor chip 120. The encapsulant 150 may be disposed to cover side surfaces and an upper surface of the semiconductor chip 120, but is not limited thereto. The encapsulant 150 may include an insulating material, for example, a thermosetting resin, such as an epoxy resin, a thermoplastic resin, such as polyimide, a pre-preg including an inorganic filler and/or glass fibers, ABF, FR-4, BT, EMC, or PID.

The package bumps 160 may be disposed in the openings of the second solder mask layer 116 on the lower surface of the package substrate 110. The package bumps 160 may physically and/or electrically connect the semiconductor package 100 to an external device, such as a main board. The package bumps 160 may have a size and diameter greater than those of the connection bumps 130. The package bumps 160 may include a low-melting-point metal, for example, tin (Sn) or an alloy (Sn—Ag—Cu) including tin (Sn), but is not limited thereto. The package bumps 160 may have a land, ball, or pin shape, and may be formed of a single layer or multiple layers. For example, the package bumps 160 may be solder balls.

Figure 3:
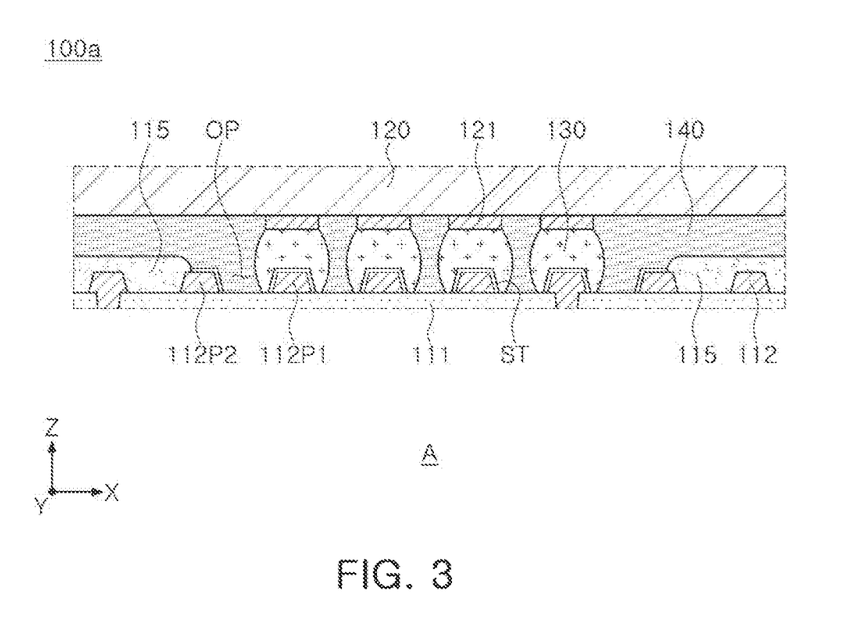
FIG. 3 is a partially enlarged view of a semiconductor package according to example embodiments.

FIG. 3 is a partially enlarged view of a semiconductor package according to example embodiments. FIG. 3 illustrates a region corresponding to FIG. 2A.

Referring to FIG. 3, in a semiconductor package 100a, an arrangement shape of the connection bumps 130 may be different from that of the embodiment of FIG. 2A. The connection bumps 130 may cover the entire upper surfaces and entire side surfaces of the first pads 112P1. The connection bumps 130 may also contact the upper surface of the uppermost insulating layer 111, but are not limited thereto. Even in this case, the connection bumps 130 may be spaced apart from the first solder mask layer 115 in the X-direction.

As described above, in various embodiments, the form in which the connection bumps 130 are connected to the first pads 112P1 may be variously changed.

Figure 4A:
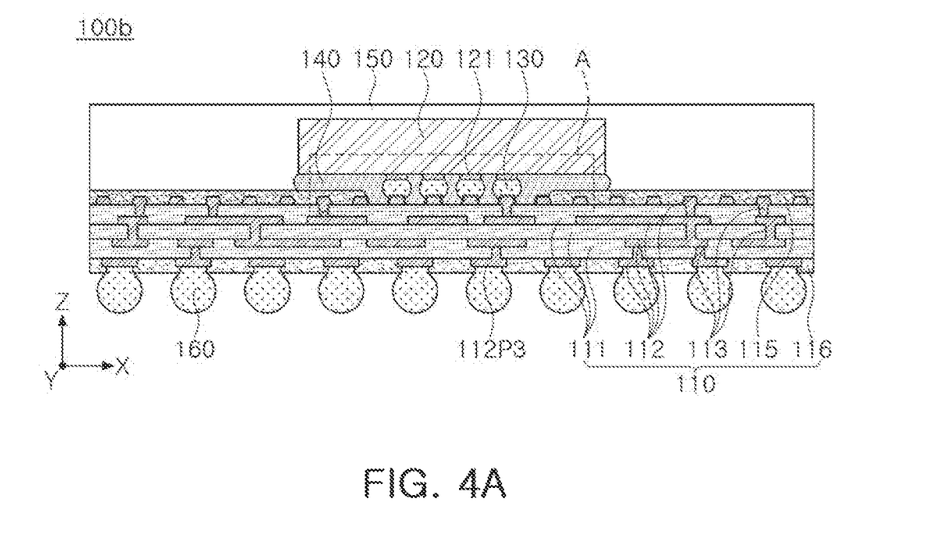
FIGS. 4A and 4B are a cross-sectional view and a partially enlarged view, respectively, of a semiconductor package according to example embodiments.
Figure 4B:
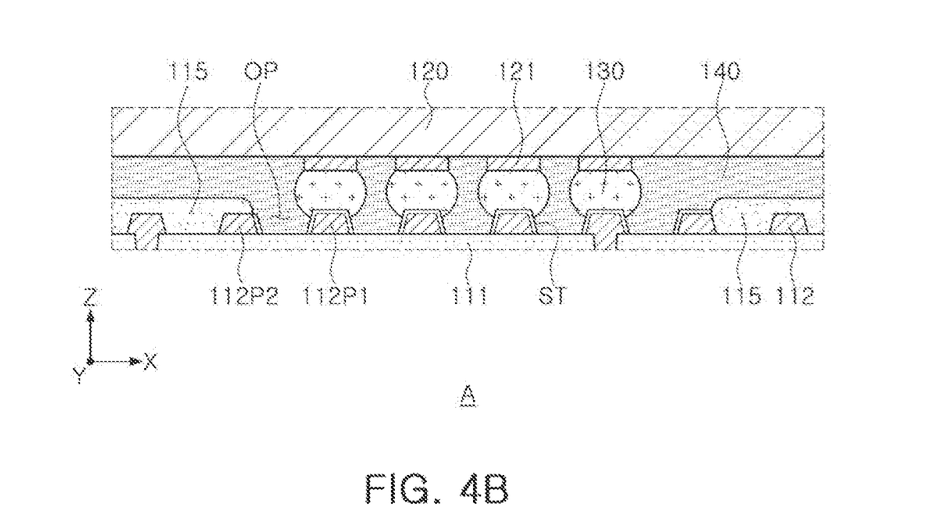

FIGS. 4A and 4B are a cross-sectional views and a partially enlarged view, respectively, of a semiconductor package according to example embodiments. FIGS. 4A and 4B illustrate regions corresponding to FIGS. 1 and 2A, respectively.

Referring to FIGS. 4A and 4B, in a semiconductor package 100b, the opening OP of the first solder mask layer 115 may be asymmetrically disposed with respect to the first pads 112P1 in the X-direction.

In the embodiment illustrated in FIGS. 4A-4B, the first solder mask layer 115 may cover the entire upper surface of the second pad 112P2 on the left side and expose the entire upper surface of the second pad 112P2 on the right side. As such, even when the opening OP is shifted to be formed during the process, the first solder mask layer 115 may expose at least a portion of the second pads 112P2. Accordingly, the occurrence of defects due to the end portion of the first solder mask layer 115 being adjacent to the first pads 112P1 may be prevented. In some embodiments, for example, the second pad 112P2 on the right side may be entirely exposed.

Figure 5A:
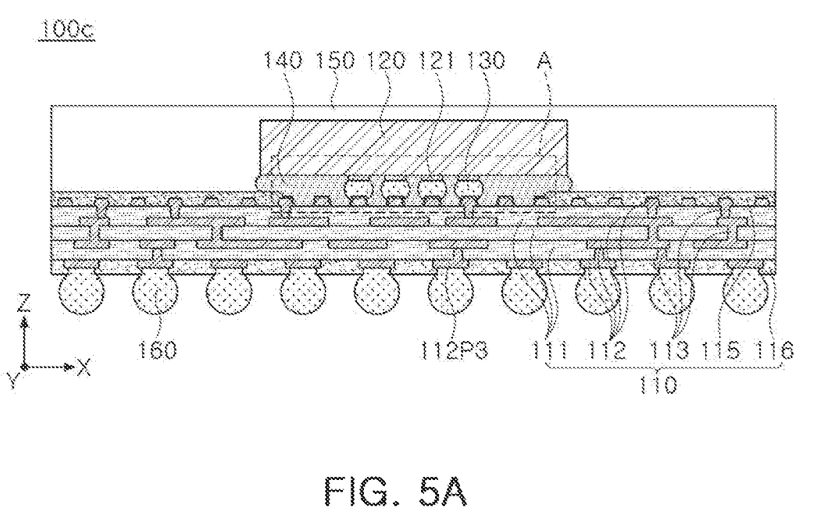
FIGS. 5A and 5B are a cross-sectional view and a partially enlarged view, respectively, of a semiconductor packages according to example embodiments.
Figure 5B:
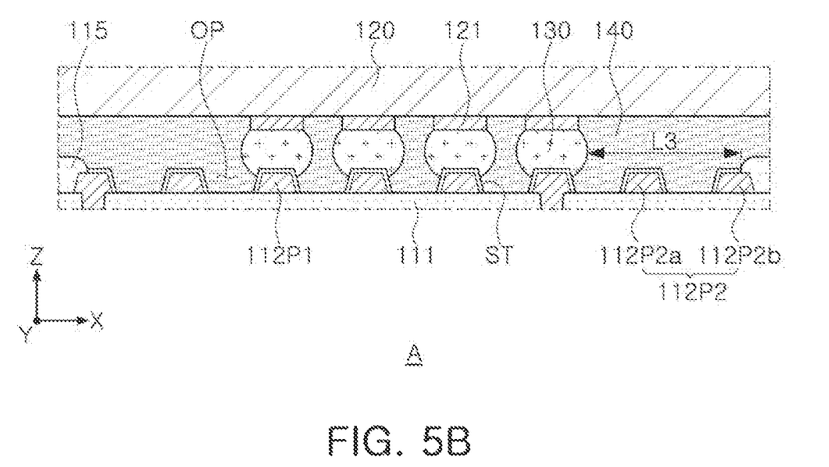

FIGS. 5A and 5B are a cross-sectional view and a partially enlarged view, respectively, of a semiconductor package according to example embodiments. FIGS. 5A and 5B illustrate regions corresponding to FIGS. 1 and 2A, respectively.

Referring to FIGS. 5A and 5B, in a semiconductor package 100c, the second pads 112P2 may include second adjacent pads 112P2a disposed to be adjacent to the first pads 112P1 and second spacing pads 112P2b disposed to be spaced apart from the first pads 112P1 by the second adjacent pads 112P2a. In other words, the second adjacent pads 112P2a may be between the second spacing pads 112P2b and the first pad 112P1. All of the second pads 112P2 may not be connected to the connection bumps 130. In other words, none of the second pads 112P2 may be connected to the connection bumps 130.

All of the second adjacent pads 112P2a may be exposed through the first solder mask layer 115 and may be located in the opening OP. A portion of upper surfaces of the second spacing pads 112P2b may be covered with the first solder mask layer 115. Accordingly, the length L3 between the connection bump 130 and the first solder mask layer 115 may be further increased.

As in the embodiment illustrated in FIGS. 5A-5B, the first solder mask layer 115 may be disposed to completely expose the second adjacent pads 112P2a, which are a portion of the second pads 112P2. In some embodiments, a plurality of second adjacent pads 112P2a may be disposed between the group of first pads 112P1 and the second spacing pad 112P2b on one side.

Figure 6A:
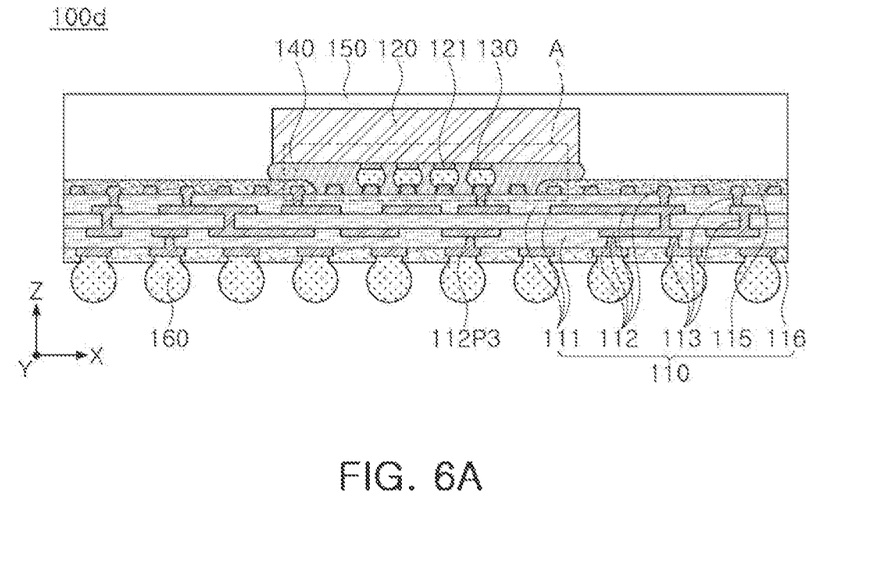
FIGS. 6A and 6B are a cross-sectional view and a partially enlarged view, respectively, of a semiconductor package according to example embodiments.
Figure 6B:
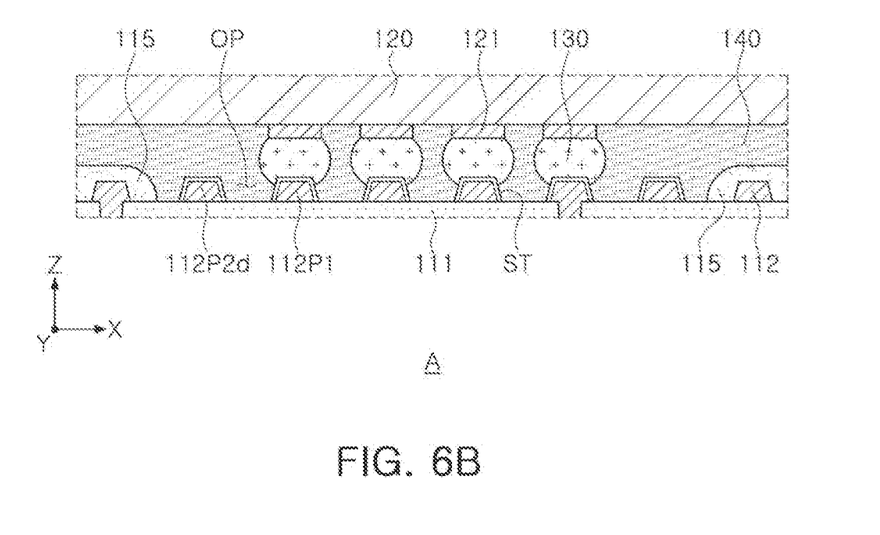

FIGS. 6A and 6B are a cross-sectional view and a partially enlarged view, respectively, of a semiconductor package according to example embodiments. FIGS. 6A and 6B illustrate regions corresponding to FIGS. 1 and 2A, respectively.

Referring to FIGS. 6A and 6B, in a semiconductor package 100d, the second pads 112P2d may be entirely exposed by the first solder mask layer 115. An end portion of the first solder mask layer 115 may be positioned between the second pads 112P2d and the redistribution layer 112 outside the second pads 112P2d.

In some embodiments, the opening OP of the first solder mask layer 115 may be asymmetrically disposed with respect to the groups of the first pads 112P1. Accordingly, in some embodiments, an outer side surface of one of the second pads 112P2d, for example, a side surface not facing the first pads 112P1, may contact the first solder mask layer 115.

Figure 7A:
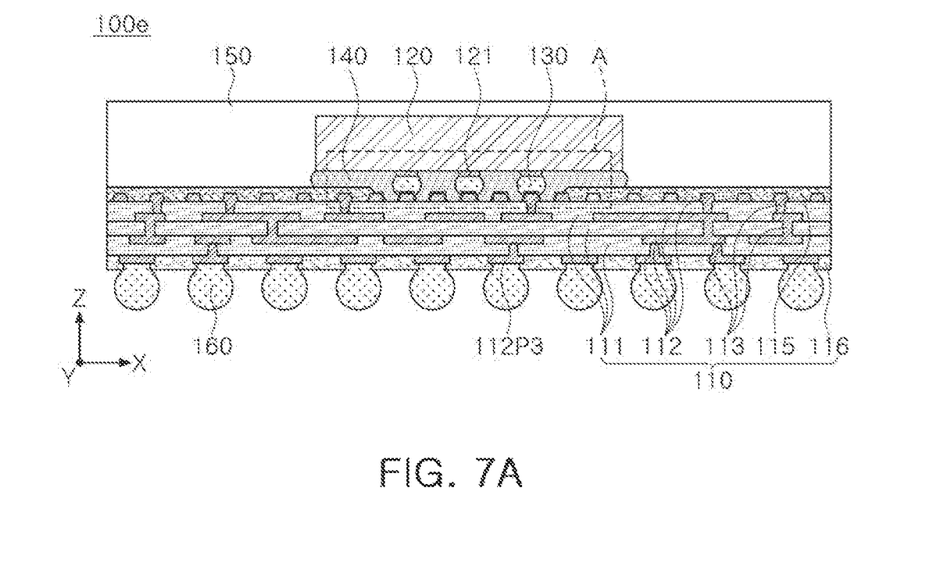
FIGS. 7A and 7B are a cross-sectional view and a partially enlarged view, respectively, of a semiconductor package according to example embodiments.
Figure 7B:
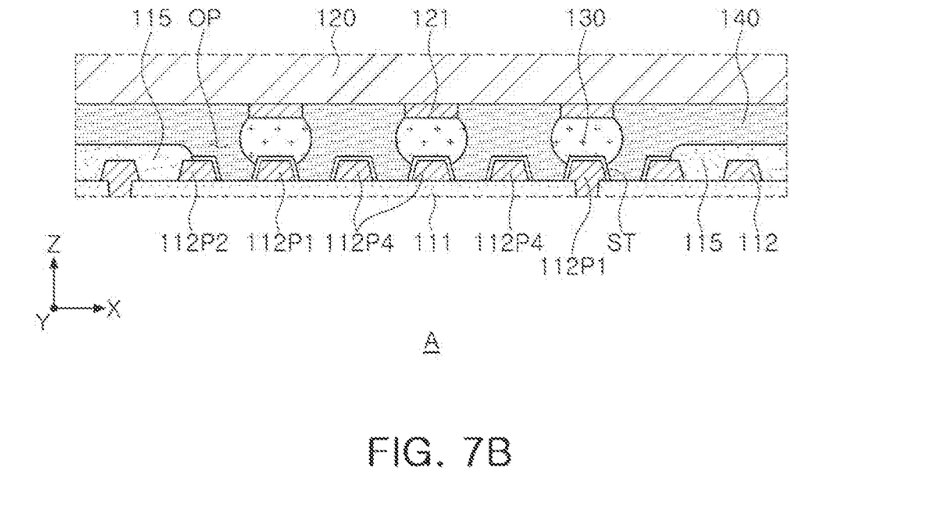

FIGS. 7A and 7B are a cross-sectional view and a partially enlarged view, respectively, of a semiconductor package according to example embodiments. FIGS. 7A and 7B illustrate regions corresponding to FIGS. 1 and 2A, respectively.

Referring to FIGS. 7A and 7B, in a semiconductor package 100e, the redistribution layers 112 may further include fourth pads 112P4 disposed between the first pads 112P1.

All of the fourth pads 112P4 may be exposed through the opening OP of the first solder mask layer 115. A portion of the fourth pads 112P4 may be connected to the connection bumps 130 in a cross-section, not illustrated. In some embodiments, a portion of the fourth pads 112P4 may not be connected to the connection bumps 130 in cross-section. As such, in embodiments, the first pads 112P1 may be arranged in the opening OP together with other pads, such as the fourth pads 112P4.

Figure 8A:
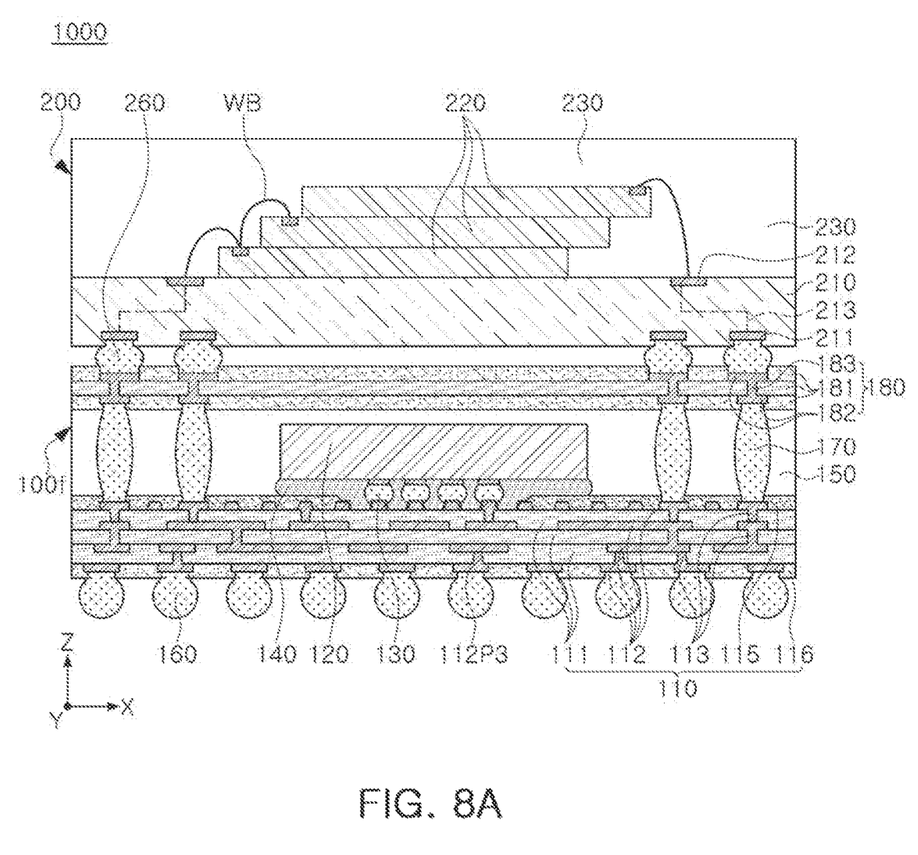
FIGS. 8A and 8B are schematic cross-sectional views of a semiconductor package according to example embodiments.
Figure 8B:
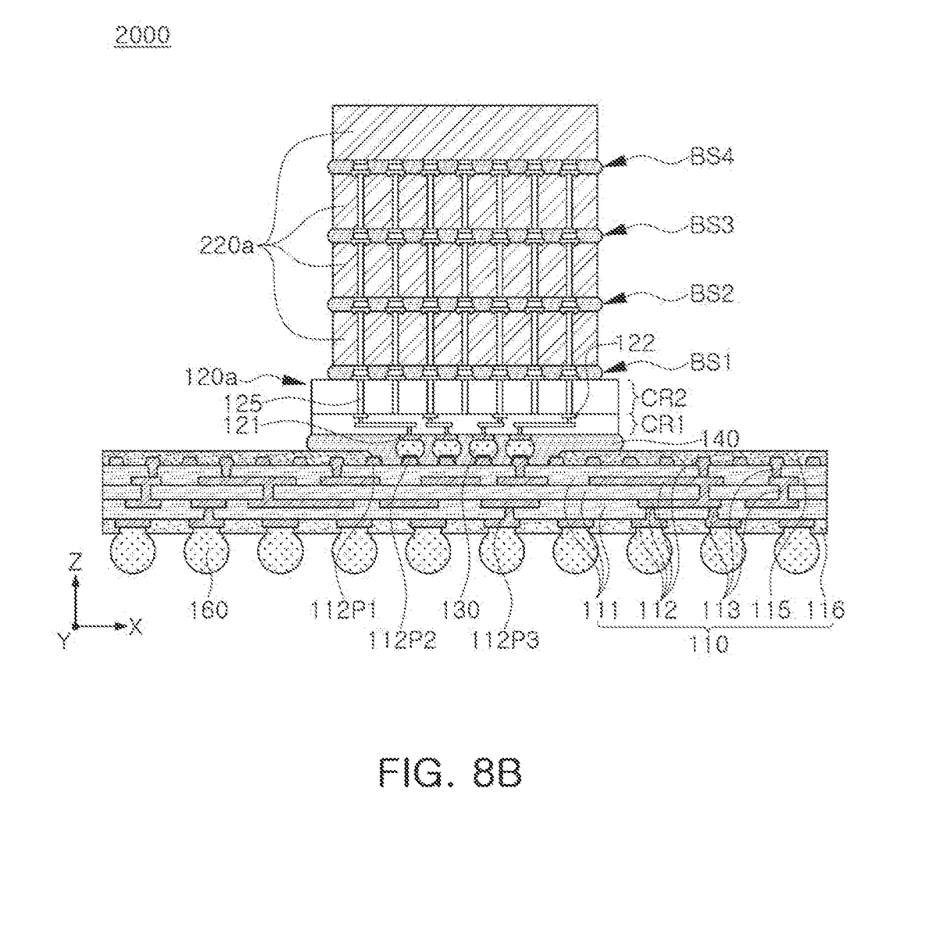

FIGS. 8A and 8B are schematic cross-sectional views of semiconductor packages according to example embodiments.

Referring to FIG. 8A, a semiconductor package 1000 may further include a second semiconductor package 200 disposed on the first semiconductor package 100f, unlike the embodiment of FIG. 1. That is, the semiconductor package 1000 may be a package on package (POP) type in which the second semiconductor package 200 is stacked on the first semiconductor package 100f and may be functionally a system-in-package (SIP).

Compared with the semiconductor package 100 described above with reference to FIGS. 1 to 2B, the first semiconductor package 100f may further include conductive posts 170 penetrating through the encapsulant 150 and may further include an interposer substrate 180 on the conductive posts 170.

The conductive posts 170 may be disposed between the package substrate 110 and the interposer substrate 180 to electrically connect the package substrate 110 to the interposer substrate 180. The conductive posts 170 may extend in a vertical direction, for example, the Z-direction, between the package substrate 110 and the interposer substrate 180 to provide a vertical connection path electrically connecting the redistribution layer 112 and the upper wiring layer 182 to each other. The conductive posts 170 may include, for example, tin (Sn), indium (In), bismuth (Bi), antimony (Sb), copper (Cu), silver (Ag), zinc (Zn), lead (Pb), or alloys thereof, and may have a spherical or ball shape extending in the Z-direction.

The interposer substrate 180 is a substrate providing a redistribution layer on an upper surface of the first package 100f and may be disposed between a lower package and an upper package in the POP structure. The interposer substrate 180 may include upper insulating layers 181, upper wiring layers 182, and wiring vias 183. The upper insulating layers 181, the upper wiring layers 182, and the wiring vias 183 have characteristics the same as or similar to those of the insulating layers 111, the redistribution layers 112, and the redistribution of the package substrate 110 described above, and thus, a redundant description thereof will be omitted for conciseness. The uppermost and lowermost upper insulating layers 181, among the upper insulating layers 181, may be solder mask layers protecting the upper wiring layers 182 and include openings exposing at least some of the upper wiring layers 182.

Although the first semiconductor package 100f has a structure including the first and second pads 112P1 and 112P2 and the first solder mask layer 115 according to the embodiment of FIGS. 1 to 2B, embodiments are not limited thereto. In some example embodiments, any one of the embodiments described above with reference to FIGS. 1 to 7B may be employed for the first semiconductor package 100f.

The second semiconductor package 200 may include a substrate 210, one or more upper semiconductor chips 220, an upper encapsulant 230, and upper connection bumps 260.

The substrate 210 may include upper pads 212 and lower pads 211 exposed through upper and lower surfaces of the substrate 210. The substrate 210 may include, for example, silicon (Si), glass, ceramic, or plastic. The substrate 210 may include an electrical path 213 by wiring patterns therein, and the wiring patterns may have a multilayer structure.

The one or more upper semiconductor chips 220 may include a logic semiconductor chip and/or a memory semiconductor chip. An element layer may be disposed below the upper semiconductor chips 220, so that a lower surface of the upper semiconductor chips 220 may be an active surface, but a position of the active surface may be variously changed. The upper semiconductor chips 220 may be mounted on the substrate 210 by wire bonding or flip chip bonding. For example, the plurality of upper semiconductor chips 220 may be vertically stacked on the substrate 210 and may be electrically connected to the upper pad 212 of the substrate 210 by a bonding wire WB. For example, the upper semiconductor chips 220 may include a memory chip, and the semiconductor chip 120 of the first semiconductor package 100f may include an AP chip.

The upper encapsulant 230 may be disposed to surround the upper semiconductor chips 220 to protect the upper semiconductor chips 220. The upper encapsulant 230 may be formed of, for example, a silicone-based material, a thermosetting material, a thermoplastic material, a UV-treated material, or the like.

The upper connection bumps 260 may be disposed on the lower surface of the substrate 210. The upper connection bumps 260 may connect the second semiconductor package 200 to the lower first semiconductor package 100f, thereby electrically and physically connecting the first and second semiconductor packages 100f and 200 to each other. The upper connection bumps 260 may include at least one of a conductive material, for example, solder, tin (Sn), silver (Ag), copper (Cu), and aluminum (Al).

However, the structure of the second semiconductor package 200 may be an example, and semiconductor packages having various structures may be stacked on the first semiconductor package 100f.

Referring to FIG. 8B, unlike the embodiment of FIG. 1, the semiconductor package 2000 may further include a plurality of upper semiconductor chips 220a stacked on a semiconductor chip 120a on the package substrate 110. For example, the semiconductor package 2000 may be a SIP, the semiconductor chip 120a may be a logic semiconductor chip, and the upper semiconductor chips 220a may be memory semiconductor chips. In some embodiments, the semiconductor chip 120a may be a logic semiconductor chip and a memory semiconductor chip, and the upper semiconductor chips 220a may be memory semiconductor chips.

The semiconductor chip 120a of the embodiment illustrated in FIG. 8B may have a lower first region CR1 and an upper second region CR2, and may further include element layers 122 and through-vias 125. The first region CR1 may be an element region, and may be a region in which devices, such as transistors and/or memory cells constituting a semiconductor chip are formed based on the second region CR2. The second region CR2 may be a substrate region, for example, a region including a semiconductor material, such as silicon (Si). Although the semiconductor chip 120a is illustrated to be larger than the upper semiconductor chips 220a in FIG. 8B, the size of the semiconductor chip 120a is not limited thereto. In some embodiments, the semiconductor chip 120a may have the same size as that of the upper semiconductor chips 220a.

The element layers 122 may be disposed in the first region CR1 to configure the elements. The through-vias 125 may pass through the second region CR2 of the semiconductor chip 120a. In some embodiments, the through-vias 125 may further pass through at least a portion of the first region CR1. The through-vias 125 may be electrically connected to the element layers 122 of the first region CR1, and may provide an electrical connection between the upper semiconductor chips 220a and the package substrate 110. The through-vias 125 may be formed of a conductive material, and may include, for example, at least one of tungsten (W), aluminum (Al), and copper (Cu).

In addition to the above description, the description of the semiconductor package 100 given above with reference to FIGS. 1 to 2B may be equally applied to the package substrate 110 and the semiconductor chip 120a.

The upper semiconductor chips 220a may be stacked on the semiconductor chip 120a in the Z-direction. The upper semiconductor chips 220a, except for the uppermost upper semiconductor chip 220a, may include through-vias 125. A first connection region BS1 may be formed between the semiconductor chip 120a and the upper semiconductor chip 220a, and second to fourth connection regions BS2, BS3, and BS4 may be located between the second semiconductor chips 220a, respectively. Although not specifically illustrated, at least some of the first to fourth connection regions BS1, BS2, BS3, and BS4 have a structure substantially the same as that of the connection region between the package substrate 110 and the semiconductor chip 120a. For example, in each of the first to fourth connection regions BS1, BS2, BS3, and BS4, besides the first pads 112P1 connected to the connection bumps 130, at least a portion of the second pads 112P2 may be exposed by the first solder mask layer 115.

FIGS. 9A to 9D are views schematically illustrating operations of method of manufacturing a semiconductor package according to example embodiments. An embodiment of a method of manufacturing the semiconductor package of FIGS. 1 and 2B will be described with reference to FIGS. 9A to 9D.

Figure 9A:
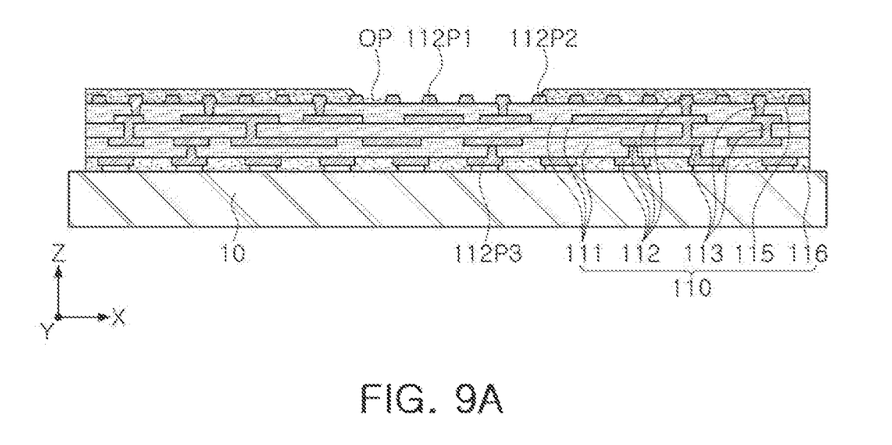
FIGS. 9A to 9D are views schematically illustrating operations of method of manufacturing a semiconductor package according to example embodiments.

Referring to FIG. 9A, the package substrate 110 may be prepared on a carrier substrate 10.

The package substrate 110 may have the first solder mask layer 115 formed thereon. Through the opening OP of the first solder mask layer 115, all of the first pads 112P1 may be exposed and at least a portion of the second pads 112P2 may be exposed.

Even when the first and second pads 112P1 and 112P2 are arranged at a relatively fine pitch, the end portions of the first solder mask layer 115 are located on the second pads 112P2 and thus may be sufficiently spaced apart from the first pads 112P1. Therefore, unlike the case in which an etch residual reaction occurs because a space between the first pad 112P1 and the end portion of the first solder mask layer 115 is relatively narrow, a phenomenon that the first solder mask layer 115 is lifted from an upper surface of the insulating layer 111 may be prevented.

Figure 9B:
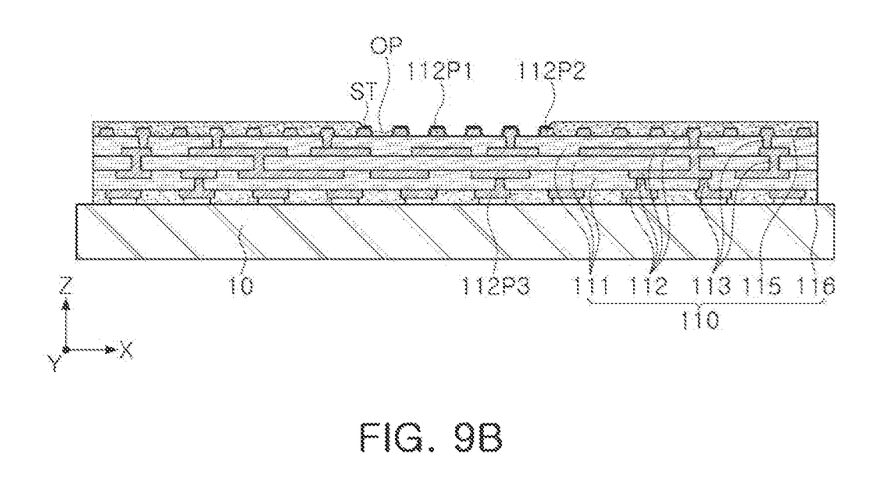

Referring to FIG. 9B, a surface treatment layer ST may be formed on surfaces of the first and second pads 112P1 and 112P2 exposed through the opening OP of the first solder mask layer 115.

The surface treatment layer ST may be formed by, for example, a plating process, and may include at least one of nickel (Ni) and gold (Au). However, in some embodiments, this operation may be omitted.

Figure 9C:
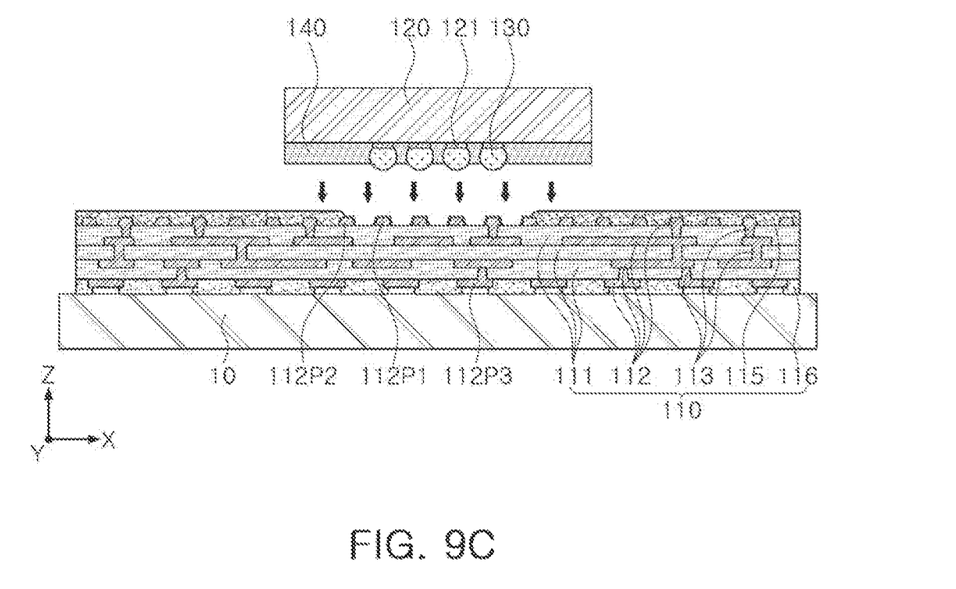

Referring to FIG. 9C, the semiconductor chip 120 may be mounted on the package substrate 110.

The semiconductor chip 120 may be prepared in a state in which the non-conductive film layer 140 is formed on a lower surface thereof and the connection bumps 130 are disposed on lower surfaces of the connection pads 121. In some embodiments, the non-conductive film layer 140 may be formed on the upper surface of the package substrate 110. The semiconductor chip 120 may be bonded to the package substrate 110 by, for example, a thermos-compression bonding (TCB) process. In this case, the semiconductor chip 120 may be aligned on the package substrate 110 using a separate bonding tool, and may be bonded to the package substrate 110 by receiving heat and pressure from the bonding tool.

In the case of the TCB process, more pressure may be applied than in the case of using a reflow process. Accordingly, if the first solder mask layer 115 is lifted from the upper surface of the insulating layer 111, the connection bumps 130 may flow into a region between the first solder mask layer 115 and the insulating layer 111. However, according to embodiments described above, since the lifting phenomenon of the first solder mask layer 115 is prevented, a defect that the connection bumps 130 extend to the lower surface of the first solder mask layer 115 may be prevented.

Figure 9D:
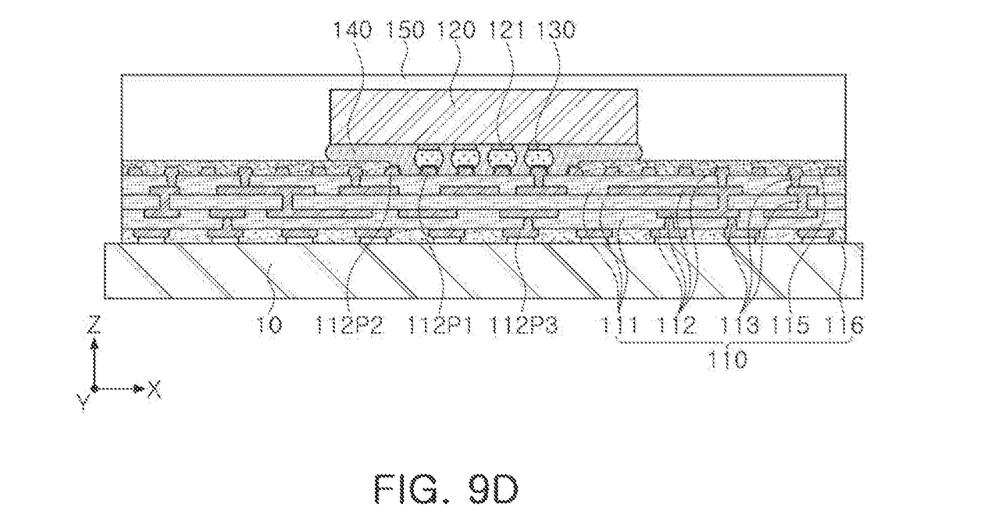

Referring to FIG. 9D, the encapsulant 150 may be formed on the mounted semiconductor chip 120.

During a process in which the semiconductor chip 120 is mounted, the non-conductive film layer 140 may be partially melted and then cured. Accordingly, the non-conductive film layer 140 may protrude to the outside of the semiconductor chip 120, and the protruded length may be relatively large in the center in the thickness direction.

The encapsulant 150 may be formed to cover the semiconductor chip 120 and to cover the upper surface of the package substrate 110. The encapsulant 150 may be formed by laminating a sealing material as a film or by applying and curing a sealing material in a liquid form. The encapsulant 150 may include an insulating material, for example, EMC.

Referring to FIG. 1 and FIG. 9D together, the carrier substrate 10 may be removed from the bottom of the package substrate 110 and package bumps 160 may be formed. The package bumps 160 may be formed, for example, by attaching conductive balls constituting the package bumps 160 and performing a reflow process. Accordingly, the semiconductor package 100 of FIG. 1 may be manufactured.

By disposing the solder mask layer of the package substrate to expose some of the pads not connected to the connection bumps, a semiconductor package having improved reliability may be provided.

While example embodiments have been illustrated and described above, it will be apparent to those skilled in the art that modifications and variations could be made without departing from the scope of the present disclosure as defined by the appended claims.

What is claimed is:
1. A semiconductor package comprising:
 a package substrate including a redistribution layer including first pads and second pads on an upper surface of the package substrate and a solder mask layer having an opening entirely exposing the first pads and exposing at least portion of each of the second pads;

a semiconductor chip on the upper surface of the package substrate and including connection pads electrically connected to the redistribution layer;

connection bumps below the semiconductor chip and connecting the connection pads to the first pads; and a non-conductive film layer between the semiconductor chip and the package substrate, wherein the second pads are respectively disposed on both sides of the first pads at least in a first direction, and the connection bumps are spaced apart from the second pads and the solder mask layer in the first direction.

2. The semiconductor package of claim 1, wherein the solder mask layer exposes at least a first side surface of each of the second pads.

3. The semiconductor package of claim 2, wherein, in each of the second pads, the first side surface faces the first pads.

4. The semiconductor package of claim 1, wherein the solder mask layer exposes about 50% to about 100% of an upper surface of each of the second pads.

5. The semiconductor package of claim 1, wherein, in the solder mask layer, an end portion defining the opening is located on an upper surface of one of the second pads.

6. The semiconductor package of claim 1, wherein the connection bumps are vertically spaced apart from the upper surface of the package substrate.

7. The semiconductor package of claim 1, wherein each of the first pads and the second pads includes a surface treatment layer on a surface exposed through the opening of the solder mask layer.

8. The semiconductor package of claim 1, wherein a pitch of the connection bumps is in a range of about 10 μm to about 100 μm.

9. The semiconductor package of claim 1, wherein the solder mask layer exposes the second pads asymmetrically in the first direction.

10. The semiconductor package of claim 1, wherein the redistribution layer further includes third pads between the first pads, the third pads being entirely exposed by the opening of the solder mask layer.

11. The semiconductor package of claim 1, wherein a surface of each of the second pads exposed by the opening of the solder mask layer is in contact with the non-conductive film layer.

12. The semiconductor package of claim 1, wherein the non-conductive film layer protrudes toward an outside of the semiconductor chip in regions adjacent to end portions of the semiconductor chip.

13. The semiconductor package of claim 12, wherein the non-conductive film layer protrudes by a first length from a center in a thickness direction of the semiconductor package and protrudes by a second length from a lower surface of the non-conductive film layer, the second length being less than the first length.

14. A semiconductor package comprising:

a package substrate including a redistribution layer including first pads and second pads on an upper surface of the package substrate and a solder mask layer having an opening entirely exposing the first pads and exposing at least portion of each of the second pads;

a semiconductor structure on the upper surface of the package substrate and including connection pads electrically connected to the redistribution layer; and connection bumps connecting the connection pads to the first pads, wherein the second pads are respectively disposed on both sides of a group of the first pads in a first direction;

the first pads and the second pads are arranged at a first pitch, and the connection bumps are spaced apart from the solder mask layer in the first direction by a distance of about 30% or more of the first pitch.

15. The semiconductor package of claim 14, wherein the second pads are not connected to the connection bumps.

16. The semiconductor package of claim 14, wherein the connection bumps are spaced apart from the second pads in the first direction.

17. The semiconductor package of claim 14, wherein a portion of the second pads are entirely exposed by the opening of the solder mask layer.

18. The semiconductor package of claim 17, wherein, the first pads form a group of first pads, the second pads include second adjacent pads that are adjacent to the group of first pads in the first direction and second spacing pads that are spaced apart from the group of first pads in the first direction by the second adjacent pads, the second adjacent pads are entirely exposed by the opening, and each of the second spacing pads is partially exposed by the opening.

19. A semiconductor package comprising:

a package substrate including a redistribution layer including first pads and second pads on an upper surface of the package substrate and a solder mask layer having an opening entirely exposing the first pads and exposing at least portion of each of the second pads;

a semiconductor chip on the upper surface of the package substrate and including connection pads electrically connected to the redistribution layer;

connection bumps connecting the connection pads to the first pads; and a non-conductive film layer between the semiconductor chip and the package substrate, the non-conductive film layer surrounding the connection bumps, wherein the second pads are respectively disposed on both sides of a group of the first pads in a first direction, and upper surfaces and side surfaces of the second pads are entirely covered by the solder mask layer and the non-conductive film layer.

20. The semiconductor package of claim 19, wherein the connection bumps are spaced apart from the solder mask layer in the first direction.

* * * * *